MULIPLE FREQUENCY OSCILLATOR UTILIZING PLURAL FEEDBACK LOOPS

Filed Aug. 9, 1961

INVENTOR.
ROBERT A. BOUDRIAS
BY Edward A. Robinson
ATTORNEY

United States Patent Office 3,137,826

Patented June 16, 1964

3,137,826

MULTIPLE FREQUENCY OSCILLATOR UTILIZING PLURAL FEEDBACK LOOPS

Robert A. Boudrias, Palo Alto, Calif., assignor to General Precision, Inc., Binghamton, N.Y., a corporation of Delaware Filed Aug. 9, 1961, Ser. No. 130,274

2 Claims. (Cl. 331—60)

Figure 1:
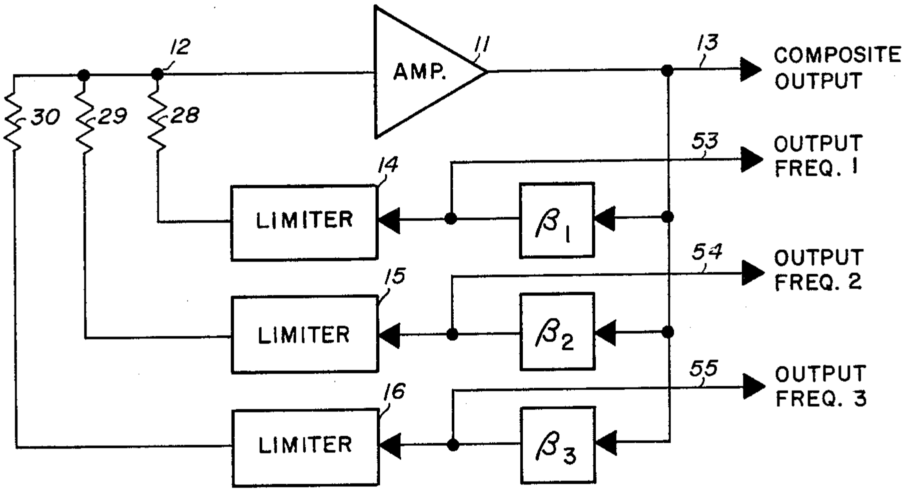

This invention relates to oscillator circuits, and more particularly, this invention relates to a circuit for generating an output signal comprising simultaneous oscillations of several frequencies.

An oscillating circuit may be considered to be a type of amplifier wherein the output signal is fed back to the input of the circuit with a positive polarity or phase relationship such that the signal will be re-amplified or regenerated. A simple amplifying circuit having a positive feedback path may provide a signal which is self-perpetuated in a closed loop arrangement. The frequency at which such a circuit will oscillate may be determined by the characteristics or parameters of the feedback circuit. If a feedback path is provided having a tuned circuit or network for passing a particular frequency from the output to the input of the amplifier, the amplifier will be caused to oscillate at that tuned frequency of the feedback path.

Ordinarily, the output signal level of an oscillator circuit is determined by the forward gain of the amplifier. In many cases, an amplifier will alternate between a cut off condition with no current flow, and a saturation condition with maximum current flow such that the output signal will appear as a square wave alternating between cut off and saturation. Since the amplifier is normally driven to saturation by a single output wave which is fed back to the input, it has not been possible for a single amplifier-oscillator circuit to generate more than the single frequency to which it is tuned.

A co-pending patent application for United States Letters Patent, Serial No. 15,597, entitled "Signalling System," was filed by Robert A. Kleist on March 17, 1960, and is assigned to the same assignee as the instant application. This co-pending application discloses a method and means for generating a single sideband modulated signal using a plurality of oscillator circuits. One of the oscillators generated a carrier wave and the other oscillators directly generated sideband waves which were summed together in an amplifier. This co-pending patent application disclosed a novel method for communication, but required several oscillators for generating the several signals of different frequencies which were required.

It is an object of this invention to provide an improved method and means for generating a signal comprising a composite of several different frequencies, and more specifically, it is an object to provide an improved oscillator circuit capable of oscillating at several frequencies simultaneously.

Another object of this invention is to provide an improved oscillator circuit wherein a single limiting network is included in the feedback path to control the oscillator gain such that the amplifier or forward gain circuits of the oscillator are not driven to saturation.

Figure 2:
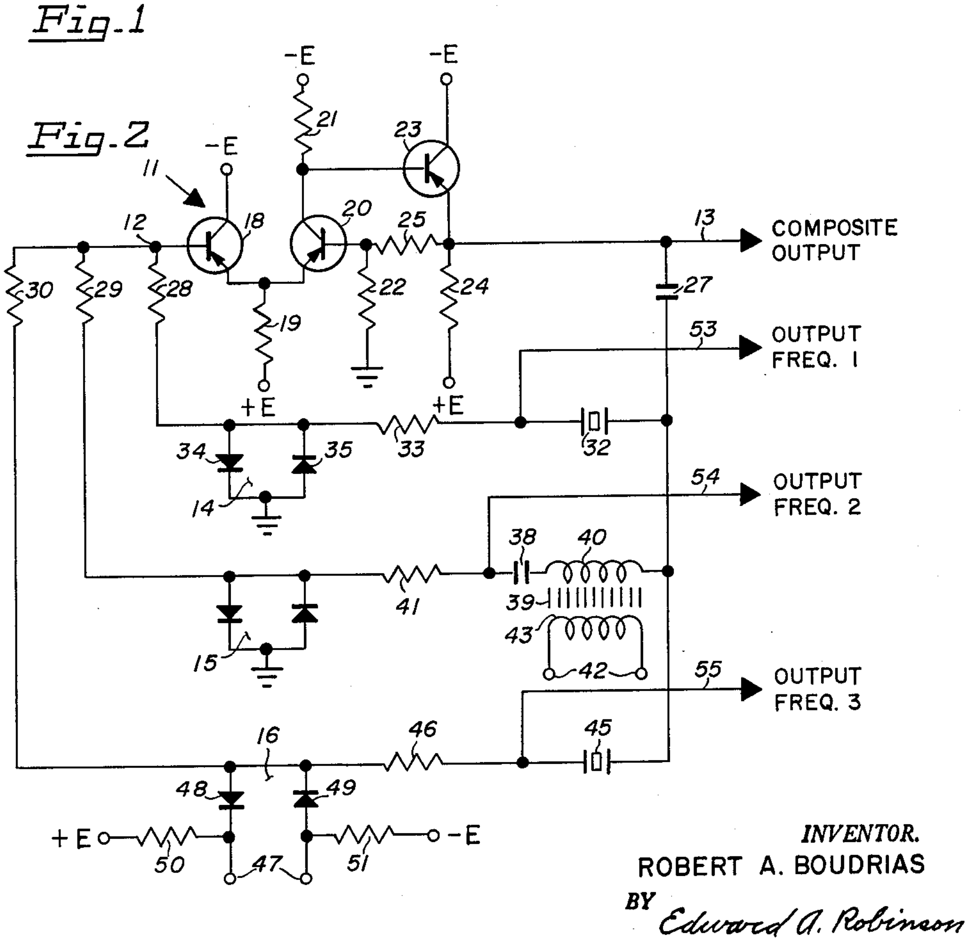

Numerous other objects and advantages will be apparent throughout the progress of the specification which follows. The accompanying drawings illustrate certain selected embodiments of the invention and the views therein are as follows:

FIGURE 1 is a schematic diagram of an oscillator circuit of this invention wherein the component circuits are represented by blocks; and FIGURE 2 is a complete circuit diagram of the oscillator illustrating several of the different types of feedback paths which are possible.

Briefly stated, according to an exemplary form of this invention, an oscillator comprises a high gain amplifier 11 having an input summing junction 12 and an output terminal 13. A plurality of feedback paths are operatively associated wtih the amplifier to pass signals of selective frequencies from the output terminal 13 to the input summing junction 12. Each feedback path includes a frequency sensitive circuit $\beta_1$, $\beta_2$, and $\beta_3$ and a limiter circuit 14, 15 and 16. The frequency sensitive circuits $\beta_1$, $\beta_2$, and $\beta_3$ are tuned to pass selected frequencies, and the limiter circuits 14, 15 and 16 control the amplitude of the feedback signals. Because the signals are fed back at limited amplitudes, the amplification capability of the amplifier 11 is not exceeded, and the amplifier 11 is never driven to saturation. Therefore, all of the frequencies fed back to the summing point 12 will be amplified to produce the composite signal of several frequencies at the output terminal 13.

Although the amplifier 11 may be of any conventional design, one exemplary transistorized amplifier is indicated in FIGURE 2. A first transistor 18 is connected as an emitter follower with the base electrode directly connected to the summing junction 12 and the collector electrode directly connected to a negative reference potential, —E. The emitter electrode is coupled to a positive reference potential, +E, by a load resistor 19 and is directly connected to the emitter electrode of a second transistor 20. The transistor 20 is connected to the negative reference potential by a load resistor 21. The base electrode of the transistor 20 is coupled to ground reference potential by a resistor 22. A third transistor 23 is connected as an emitter follower to provide a low impedance output signal. The base electrode of the transistor 23 is directly connected to the collector electrode of the transistor 20, and the collector electrode of the transistor 23 is directly connected to the negative reference potential, —E. The emitter electrode of the transistor 23 constitutes the output terminal 13 of the amplifier 11 and is coupled to the positive reference potential by a load resistor 24. A resistor 25 provides a negative feedback path between the transistors 23 and 20 to stabilize the output characteristics of the amplifier 11.

A capacitor of comparatively large value 27 is coupled between the output terminal 13 and the several feedback paths to block the flow of direct current therethrough. As shown in FIGURES 1 and 2 the exemplary oscillator circuit is provided with three separate positive feedback paths each coupled to the summing junction of the amplifier by a respective summing resistor 28, 29 and 30. FIGURE 1 shows these feedback paths generally each having a frequency sensitive means and a signal limiting circuit. Obviously, there are many forms of frequency sensitive circuits or networks and of limiter circuits, and it is not necessary to limit the number of such positive feedback circuits to the three shown in the drawing. Neither is it necessary that the various feedback circuits be similar to each other in structure. However, the total signal level from all feedback circuits to the summing junction 12 should not exceed the capabilities of the amplifier 11. FIGURE 2 illustrates three separate types of feedback arrangements which could be used separately or in the combination with each other as indicated or in other combinations which may meet requirements of a circuit designer.

The first feedback circuit of FIGURE 2 includes a piezo electric crystal 32 which constitutes the frequency sensitive means, $\beta_1$, a coupling resistor 33, and a signal limiting circuit 14 including a pair of diodes 34 and 35. The crystal 32 may be considered the electrical equivalent of a tuned circuit capable of passing a single precise frequency. The single frequency passed by the crystal 32 is coupled to the limiter circuit 14 by the resistor 33.

The limiter circuit 14 comprises a pair of diodes 34 and 35 coupled to the ground reference potential and oppositely polarized as indicated in FIGURE 2. A silicon or germanium diode as such will conduct in a forward direction with a voltage drop thereacross which may be in the range of from .2 to .8 volt; and therefore, the signal appearing on the lead 36 may not exceed the predetermined forward voltage drop of the diodes 34 and 35, since these diodes will effectively clip the wave at the amplitude determined by their conductive characteristics. Therefore, it will be appreciated that the first feedback path will pass signals having a frequency determined by the crystal 32 and having an amplitude determined by the diode clipping circuit 14.

The second feedback circuit shown in FIGURE 2 includes a series tuned circuit including a capacitor 38 and a variable inductance means such as a saturable reactor 39. The capacitor 38 and a winding 40 of the saturable reactor 39 constitues a series resonant circuit which will present a high impedance to all frequencies except that frequency to which it is tuned whereby a selected frequency will be passed via a resistor 41 to a diode clipping circuit 15 which is similar to the diode circuit 14 described above.

The inductive reactance of the winding 40 may be varied by a low frequency current applied to input terminals 42 which flows through a primary winding 43 and causes the reactor 39 to saturate magnetically. Variation in the inductive reactance value of the winding 40 will cause a variation in the tuning of the series resonant circuit 38–40. Therefore, an audio signal applied to the terminals 42 will swing the frequency of the signals passed by the signal feedback circuit whereby these signals will be frequency modulated by the audio signal.

The third feedback path indicated in FIGURE 2 includes another piezoelectric crystal 45, a coupling resistor 46 and a diode clipping circuit 16. As in the first feedback path the frequency of the feedback signal is controlled by a crystal, but the diode clipping circuit 16 has been modified to permit amplitude modulation of the feedback signal. In this case, an audio or low frequency signal is applied to terminals 47 to vary the bias voltage applied to the diodes 48 and 49 and effectively vary the cut off levels thereof. The diode 48 is coupled to a positive reference potential, +E, by a resistor 50, and the diode 49, connected in reversed polarity, is coupled to the negative reference potential, −E, by a resistor 51. As the input signal applied to the terminals 41 increases during a first half cycle of the wave, the potential at one terminal may increase with positive polarity while the potential at the other terminal increases with negative polarity. During the next half cycle of the audio input wave, the potentials at the terminals 47 may decrease in opposite polarities. Since the polarities of the diodes 48 and 49 are opposite with respect to each other, and since the reference potentials coupled to the diodes are of opposite polarities, the audio wave applied to the terminals 47 will either add to and subtract from the biasing of the diodes in unison to vary the clipping level and modulation envelope of the wave passed by the resistor 46 and to effectively amplitude modulate that wave.

It will be appreciated that the three different types of feedback circuits could be applied to the same amplifier as shown in FIGURE 2 to provide a composite output signal having (1) a constant carrier wave, (2) a frequency modulated wave bearing information from one source, and (3) an amplitude modulated wave bearing other information from a second source. Obviously, other combinations of feedback circuits may be used to provide either a simpler or a more complex composite output signal. While the clipping circuits 14, 15 and 16 are each illustrated as a pair of diodes, it will be appreciated that other forms of clipping circuits may be utilized which will provide either a constant amplitude feedback signal or an amplitude modulated feedback signal. Amplitude modulation may also be provided by the use of a nonlinear resistor substituted for the summing resistor 30 with appropriate circuit means for varying the resistance value at an audio rate.

Since the diode limiting circuits 14, 15 and 16 essentially clip the feedback waves, the composite feedback signal appearing at the summing point 12 will contain square or flat top waves. Since the amplifier 11 is not driven to saturation, its mode of operation will be class A, and the composite output signal appearing at the terminal 13 will likewise be a combination of square waves. If the generation of sine waves is desired, the various sine wave frequencies may be obtained at output terminals 53, 54 and 55. In each case, the sine wave output was taken from a point on the feedback path subsequent to the frequency sensitive means $\beta_1$, $\beta_2$, and $\beta_3$ but prior to the amplitude limiting means 14, 15 and 16.

From the foregoing, it will be appreciated that this invention provides a means for generating and modulating oscillations of several frequencies simultaneously with a minimum of apparatus and using but a single amplifying circuit. This multiple frequency oscillator would be useful in the signalling system proposed in the co-pending patent application, Serial No. 15,597, supra. This oscillator would also be useful in the field of telemetering where it is desired to transmit information from several input devices to a remote location. Such information could be modulated upon the several oscillator frequencies which would be available, and as indicated heretofore, frequency modulation and/or amplitude modulation may be used on any of the several frequencies.

Changes may be made in the form, construction and arrangement of the parts without departing from the spirit of the invention or sacrificing any of its advantages, and the right is hereby reserved to make all such changes as fall fairly within the scope of the following claims.

The invention is claimed as follows:

1. An oscillator circuit comprising an amplifier having an input terminal and an output terminal and a plurality of positive feedback circuits coupled between the output terminal and the input terminal, said amplifier circuit including three transistors each having an emitter electrode, a base electrode and a collector electrode, a first of the transistors being connected as an emitter follower with the collector electrode thereof connected directly to a first reference potential, said first transistor having the base electrode thereof directly connected to the input terminal of the amplifier, a first resistive element coupled between the emitter electrode of the first transistor and a second reference potential, the emitter electrode of the first transistor being directly coupled to the emitter electrode of the first transistor, a second resistive element coupled between the collector electrode of the second transistor and the first reference potential, a third resistive element coupled between the base electrode of the second transistor and ground potential, the base electrode of the third transistor being coupled directly to the collector electrode of the second transistor, the collector electrode of the third transistor being directly connected to the first reference potential, a fourth resistive element coupled between the base electrode of the second transistor and the emitter electrode of the third transistor, a fifth resistive element coupled between the emitter electrode of the third transistor and the second reference potential, each of the feedback circuits comprising a frequency selective means and a signal limiting means connected in series between the output terminal and the input terminal of the amplifier, the frequency selective means of at least one of the feedback circuits including a tuned circuit including a means for varying the tuning thereof at an audio rate whereby the feedback signal therefrom is frequency modulated.

2. An oscillator circuit comprising an amplifier having an input terminal and an output terminal and a plurality of positive feedback circuits coupled between the output terminal and the input terminal, said amplifier circuit including three transistors each having an emitter electrode, a base electrode and a collector electrode, a first of the transistors being connected as an emitter follower with the collector electrode thereof connected directly to a first reference potential, said first transistor having the base electrode thereof directly connected to the input terminal of the amplifier, a first resistive element coupled between the emitter electrode of the first transistor and a second reference potential, the emitter electrode of the first transistor being directly coupled to the emitter electrode of the first transistor, a second resistive element coupled between the collector electrode of the second transistor and the first reference potential, a third resistive element coupled between the base electrode of the second transistor and ground potential, the base electrode of the third transistor being coupled directly to the collector electrode of the second transistor, the collector electrode of the third transistor being directly connected to the first reference potential, a fourth resistive element coupled between the base electrode of the second transistor and the emitter electrode of the third transistor, a fifth resistive element coupled between the emitter electrode of the third transistor and the second reference potential, each of the feedback circuits comprising a frequency selective means and a signal limiting means connected in series between the output terminal and the input terminal of the amplifier, the signal limiting means of at least one of the feedback circuits including a means for varying the amplitude of the feedback signal at an audio rate whereby the feedback signal therefrom is amplitude modulated.

References Cited in the file of this patent

UNITED STATES PATENTS

| | | |
|---|---|---|
| 2,288,486 | Rivlin | June 30, 1942 |
| 2,513,760 | Toulon | July 4, 1950 |
| 2,906,970 | Wylde | Sept. 29, 1959 |
| 2,925,561 | Macdonald | Feb. 16, 1960 |
| 3,026,487 | Walsh et al. | Mar. 20, 1962 |

FOREIGN PATENTS

| | | |
|---|---|---|
| 912,618 | France | Aug. 14, 1946 |